(12) United States Patent
Torre et al.

(10) Patent No.: US 6,720,839 B1
(45) Date of Patent: Apr. 13, 2004

(54) SYSTEM OF AND METHOD FOR REDUCING OR ELIMINATING THE UNWANTED SIDEBAND IN A SIGNAL DERIVED FROM THE OUTPUT OF A QUADRATURE MODULATOR

(75) Inventors: Valentina Della Torre, Irvine, CA (US); Frederic M. Stubbe, Irvine, CA (US); Morten Damgaard, Laguna Hills, CA (US); Ricke W. Clark, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/515,633

(22) Filed: Feb. 29, 2000

(51) Int. Cl.[7] ................................................. H03C 1/00
(52) U.S. Cl. .................... 332/103; 332/170; 375/296; 455/126; 455/118; 455/260; 455/296; 455/295
(58) Field of Search ................................. 332/103, 159, 332/161, 162, 160, 170; 455/260, 295, 296, 118, 126; 375/296

(56) References Cited

U.S. PATENT DOCUMENTS

| 4,122,448 | A | * | 10/1978 | Martin | 330/52 |
| 5,162,763 | A | * | 11/1992 | Morris | 332/170 |
| 5,249,201 | A | * | 9/1993 | Posner et al. | 332/106 |
| 6,009,317 | A | * | 12/1999 | Wynn | 455/296 |

OTHER PUBLICATIONS

Moffat, Mark, et al., *An ISM band Transceiver Chip for Digital Spread Spectrum Communication*GEC Plessey Semiconductors, Inc., Scotts Valley, CA 95067, USA, Sep. 1997, (Esscirc '97).

* cited by examiner

*Primary Examiner*—Arnold Kinkead
(74) *Attorney, Agent, or Firm*—Mintz Levin Cohn Ferris Glovsky & Popeo P.C.

(57) ABSTRACT

A system of and method for reducing or eliminating any unwanted sideband component in a signal derived from the output of a quadrature modulator. An unwanted sideband detector detects the unwanted sideband in the output of the quadrature modulator, and responsive thereto, a correction circuit corrects a baseband signal prior to inputting it to the quadrature modulator. In one embodiment, the unwanted sideband detector is an envelope detector.

31 Claims, 14 Drawing Sheets

SYSTEM OF AND METHOD FOR REDUCING OR ELIMINATING THE UNWANTED SIDEBAND IN A SIGNAL DERIVED FROM THE OUTPUT OF A QUADRATURE MODULATOR

BACKGROUND OF THE INVENTION

1. Field of the Invention

This invention relates generally to quadrature modulators, and, more specifically, to reducing or eliminating the unwanted sideband in a signal derived from the output of a quadrature modulator.

2. Background

In a quadrature modulator, identified with numeral 30 in FIG. 1A, a complex baseband signal, i.e., a baseband signal having I and Q components, BBI and BBQ, assumed to be in quadrature (out of phase by 90°), is mixed with a complex local oscillator signal, also having I and Q components, LOI and LOQ, and also assumed to be in quadrature, to form an output signal. The output signal may be at the desired RF transmit frequency in the case of a direct conversion transceiver, or it may be at an intermediate frequency which must in subsequent stages be unconverted to the desired RF transmit frequency.

The I component of the baseband signal, BBI, is mixed, through mixer 31, with the I component of the local oscillator signal, LOI, and the Q component of the baseband signal, BBQ, is mixed, through mixer 32, with the Q component of the local oscillator signal, LOQ. The outputs of mixers 31 and 32 are then combined, through combiner 33, to form the output signal of the quadrature modulator.

If the I and Q components of the baseband signal, and the I and Q components of the local oscillator signal, are perfectly in quadrature, i.e., out of phase by 90° exactly, and the components of the quadrature modulator are perfectly accurate, only the "wanted" sideband will appear at the output of the quadrature modulator, and no energy will appear in the "unwanted" sideband. This follows mathematically as follows: assuming BBI can be represented as A $\cos(\omega_{BB}t+\pi/2)$, BBQ as A $\cos(\omega_{BB}t)$, LOI as B $\cos(\omega_{LO}t+\pi/2)$, and LOQ as B $\cos(\omega_{LO}t)$, then the output of the quadrature modulator, (BBI×LOI)+(BBQ×LOQ), reduces, through known mathematical identities, to A×B $\cos([\omega_{BB}+\omega_{LO}]t)$. This is the "wanted" sideband. As can be seen, there is no component at the "unwanted" sideband, i.e., at the frequency $\omega_{LO}-\omega_{BB}$.

However, in the real word, there will be some inaccuracy in the quadrature of the baseband or local oscillator signals or in the components of the quadrature modulator. That will result in some energy at the unwanted sideband frequency. This situation is illustrated in FIG. 2B, which is a frequency domain representation of the output of the quadrature modulator in the case in which there is some inaccuracy in the quadrature of the baseband or local oscillator signals or in the components of the quadrature modulator. Representing baseband as a single frequency, the wanted sideband is identified with numeral 50, while the unwanted sideband is identified with numeral 51. (Representing baseband as a range of frequencies, the wanted sideband is identified with numeral 52, while the unwanted sideband is identified with numeral 53).

Typically, as illustrated, the amplitude of the unwanted sideband is less than that of the wanted sideband. However, in extreme cases, when the quadrature inaccuracy is large, the amplitude of the unwanted sideband can approach that of the wanted sideband.

In the case in which the transmitted signal is a phase-modulated signal, the presence of the unwanted sideband in the output of the quadrature modulator translates into phase error in the transmitted signal. However, current GSM standards impose tight limits on the phase error of the transmitted signal.

In "An ISM band Transceiver Chip for Digital Spread Spectrum Communication", ESSCIRC 97, a circuit for generating the LOI and LOQ inputs is described. The circuit is illustrated in FIG. 1B. The LOI and LOQ signals are provided by a divide by two circuit comprising two D-type flip-flops 2 and 3 driven by VCO 1. These signals are input to phase detector 4, which outputs a current proportional to any deviation from quadrature in the LOI and LOQ signals. This current is integrated by integrator 5 to produce an error voltage. The error voltage is input to comparator 6 along with the output from VCO 1. The error voltage is used to modify the mark-space ratio of the VCO output in order to correct for inaccuracies in the VCO and divide by two circuit.

There are several problems with this approach. First, it does not correct for intrinsic errors in the phase detector and comparator (see FIG. 1B).

Second, it does not correct for any inaccuracies in the components of the quadrature modulator (mixers 31 and 32, and combiner 33, in FIG. 1A).

Third, it does not correct for inaccuracies in the quadrature of the baseband signal.

Fourth, it requires a highly accurate phase detector in order to be effective.

Fifth, since it involves making corrections to the LO signal, a high frequency signal, it is difficult to achieve satisfactory results with this approach.

Accordingly, there is a need for a system for and method of reducing or eliminating the unwanted sideband in the output of a quadrature modulator which overcomes one or more of the disadvantages of the prior art.

SUMMARY OF THE INVENTION

In accordance with the purpose of the invention as broadly described herein, there is provided a system of and method for reducing or eliminating the unwanted sideband in the output of a quadrature modulator in which the presence of the unwanted sideband is detected through an unwanted sideband detector applied to the output of the quadrature modulator. In one embodiment, the system comprises a baseband correction circuit, a quadrature modulator, and an envelope detector. The I and Q components of the baseband signal, BBI and BBQ, are input to the baseband correction circuit. The outputs of the baseband correction circuit, BBI' and BBQ', are input to the quadrature modulator as are the I and Q components of the local oscillator signal. The output of the quadrature modulator is input to the unwanted sideband detector. The output of the unwanted sideband detector is input to the baseband correction circuit.

Any inaccuracy in the quadrature of the baseband or local oscillator signals, or in the components of the quadrature modulator, results in an unwanted sideband in the output of the quadrature modulator. The unwanted sideband detector detects the presence of an unwanted sideband detector in the output of the quadrature modulator, and provides a signal representative thereof to the baseband correction circuit. In one embodiment, the baseband correction circuit iteratively corrects the phase relationship of the I and Q components of the baseband signal responsive to the signal provided by the unwanted sideband detector until the relationship is about a quadrature relationship. In another embodiment, the process iterates one or more times until the unwanted sideband in the output of the quadrature modulator has been reduced to an acceptable level.

In one implementation, the unwanted sideband detector is an envelope detector. This implementation of the invention exploits the property that the output of the quadrature modulator can be expressed as the superposition of an AM signal, and an FM signal whose carrier frequency $\omega_c$ is the frequency of the wanted sideband, $\omega_{BB}+\omega_{LO}$, and whose modulation frequency $\omega_m$ is the frequency offset between wanted and unwanted sidebands, $2\omega_{BB}$. Mathemetically, this property can be expressed as follows:

$$S(t) = s_{fm}(t) + s_{am}(t)$$
$$= \sin(\omega_c t) + (B/2)(\sin\{[\omega_c + \omega_m]t\} - \sin\{[\omega_c - \omega_m]t\}) +$$
$$\sin(\omega_c t) + (M/2)(\sin\{[\omega_c + \omega_m]t\} + \sin\{[\omega_c - \omega_m]t\})$$

Because of this property, the amplitude of the envelope of the output of the quadrature modulator at a given instant in time is proportional to or representative of the amplitude of the unwanted sideband. Therefore, the signal output by the envelope detector is a direct measure of the unwanted sideband.

In one embodiment, a method in accordance with the subject invention comprises the steps of correcting the I and Q components, BBI and BBQ, of a baseband signal using one or more parameters, thereby forming BBI' and BBQ'; quadrature modulating BBI' and BBQ' respectively with the I and Q components of a local oscillator, LOI and LOQ, to form an output signal; detecting an unwanted sideband from the output of the quadrature modulator; if the unwanted sideband is below a desired threshold, storing the one or more parameters; and if the unwanted sideband is not below the desired threshold, revising the one or more parameters responsive to the unwanted sideband, and returning to the correcting step. In one embodiment, the method further comprises iterating one or more times through the foregoing steps until the energy of the unwanted sideband is reduced to an acceptable level.

In one implementation, the detecting step comprises detecting the amplitude of the envelope of the output of the quadrature modulator.

An advantage of the foregoing method is that the ability to correct for any inaccuracies in the components of the quadrature modulator is provided.

Another advantage is that the ability to correct for any inaccuracies in the quadrature of the I and Q components of the baseband signal is provided.

A third advantage is that a highly accurate phase detector is not required.

A fourth advantage is that correction to a high frequency signal is not required. Instead, the invention only requires correction to the relatively low frequency baseband signal.

Additional advantages of the subject invention will be set forth in the description which follows, or will be apparent to one of skill in the art.

RELATED APPLICATIONS

This application is related to co-pending U.S. patent application Ser. No. 09/514,501, filed Feb. 29, 2000, entitled "SYSTEM OF AND METHOD FOR REDUCING OR ELIMINATING THE UNWANTED SIDEBAND IN THE OUTPUT OF A TRANSMITTER COMPRISING A QUADRATURE MODULATOR FOLLOWED BY A TRANSLATIONAL LOOP," and co-pending U.S. patent application Ser. No. 09/515,538, filed Feb. 29, 2000, entitled "SYSTEM OF AND METHOD FOR COMPENSATING A BASEBAND SIGNAL TO REDUCE THIRD ORDER MODULATION DISTORTION," both of which are owned in common by the assignee hereof, and both of which are hereby fully incorporated by reference herein as though set forth in full.

DETAILED DESCRIPTION OF THE PREFERRED EMBODIMENTS

I. Example Environment

Figure 1A:
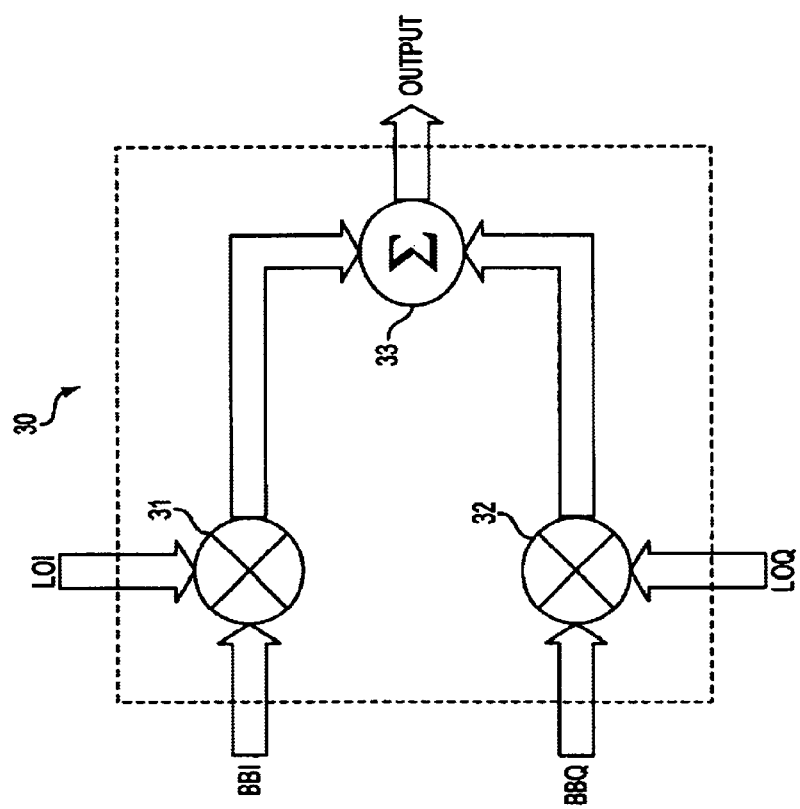
FIG. 1A illustrates a quadrature modulator.
Figure 1B:
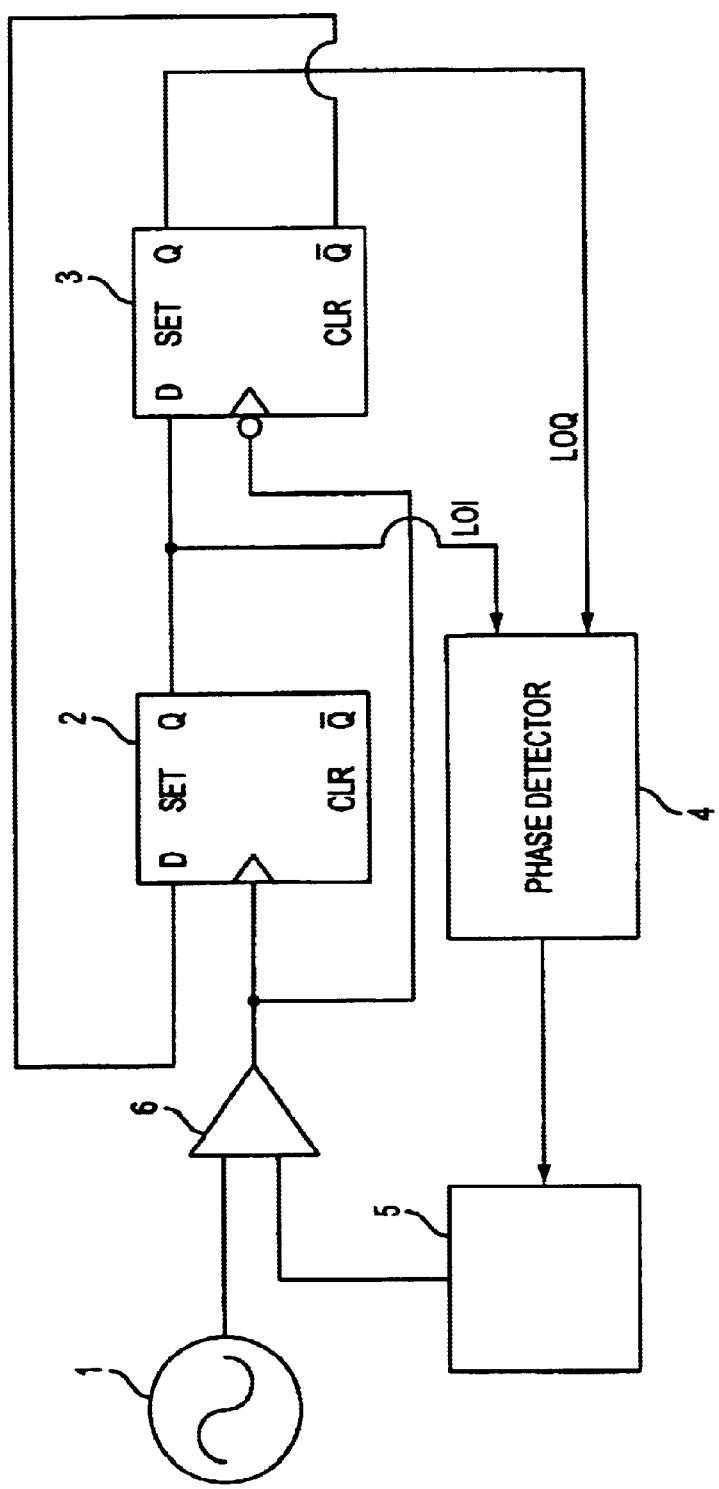
FIG. 1B illustrates a conventional circuit for generating the I and Q components of a complex LO signal.

Wireless communication systems are an integral component of the ongoing technology revolution. Mobile radio communication systems, such as cellular telephone systems, are evolving at an exponential rate. In a cellular system, a coverage area is divided into a plurality of "cells". A cell is the coverage area of a base station or transmitter. Low power transmitters are utilized, so that frequencies used in one cell can also be used in cells that are sufficiently distant to avoid interference. Hence, a cellular telephone user, whether mired in traffic gridlock or attending a meeting, can transmit and receive phone calls so long as the user is within a "cell" served by a base station.

Mobile cellular systems were originally developed as analog systems. After their introduction for commercial use in the early 1980s, mobile cellular systems began to experience rapid and uncoordinated growth. In Europe, for example, individual countries developed their own systems. Generally, the systems of individual countries were incompatible, which constricted mobile communications within national boundaries and restricted the market for mobile equipment developed for a particular country's system.

In 1982, in order to address this growing problem, the Conference of European Posts and Telecommunications (CEPT) formed the Groupe Speciale Mobile (GSM) to study and develop a set of common standards for a future pan-European cellular network. It was recommended that two blocks of frequencies in the 900 MHz range be set aside for the system.

The initial goals for the new system included international roaming ability, good subjective voice quality, compatibility with other systems such as the Integrated Services Digital Network (ISDN), spectral efficiency, low handset and base station costs, and the ability to support new services and a high volume of users. One of the initial, major decisions in the development of the GSM standard was adoption of a digital, rather than an analog, system. As mentioned above, analog systems were experiencing rapid growth and the increasing demand was straining the capacity of the available frequency bands. Digital systems offer improved spectral efficiency and are more cost efficient. The quality of digital transmission is also superior to that of analog transmission. Background sounds such as hissing and static and degrading effects such as fadeout and cross talk are largely eliminated in digital systems. Security features such as encryption are more easily implemented in a digital system. Compatibility with the ISDN is more easily achieved with a digital system. Finally, a digital approach permits the use of Very Large Scale Integration (VLSI), thereby facilitating the development of cheaper and smaller mobile handsets.

In 1989, the European Telecommunications Standards Institute (ETSI) took over responsibility for the GSM standards. In 1990, phase I of the standard was published and the first commercial services employing the GSM standard were launched in 1991. It was also renamed in 1991 as the Global System for Mobile Communications (still GSM). After its early introduction in Europe, the standard was elevated to a global stage in 1992 when introduced in Australia. Since then, GSM has become the most widely adopted and fastest growing digital cellular standard, and is positioned to become the world's dominant cellular standard. With (currently) 324 GSM networks in operation in 129 countries, GSM provides almost complete global coverage. As of January 1999, according to the GSM Memorandum of Understanding Association, GSM accounted for more than 120 million subscribers. Market research firms estimate that by 2001, there will be more than 250 million GSM subscribers worldwide. At that time, GSM will account for almost 60% of the global cellular subscriber base, with yearly shipments exceeding 100 million phones.

Figure 6A:
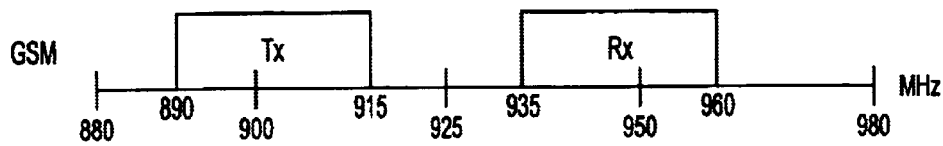
FIG. 6A illustrates the transmit and receive frequency bands under the GSM standard.
Figure 6B:
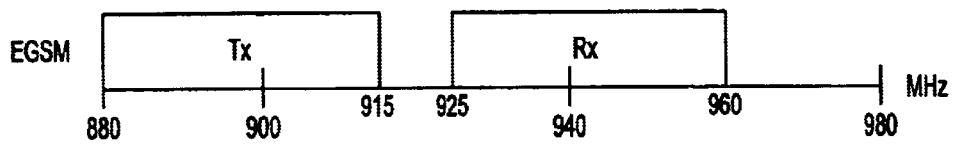
FIG. 6B illustrates the transmit and receive frequency bands under the EGSM standard.

Two frequency bands of 25 MHz were allocated for GSM use. As illustrated in FIG. 6a, the 890–915 MHz band is reserved for transmission or "uplink" (mobile station to base station), and the 935–960 MHz band is reserved for reception or "downlink" (base station to mobile station). An extra ten MHz of bandwidth was later added to each frequency band. The standard incorporating this extra bandwidth (two 35 MHz bands) is known as Extended GSM (EGSM). In EGSM, the transmission band covers 880–915 MHz and the receiving band covers 925–960 MHz (FIG. 6b). The terms GSM and EGSM are used interchangeably, with GSM sometimes used in reference to the extended bandwidth portions (880–890 MHz and 925–935 MHz). Sometimes, the originally specified 890–915 MHz and 935–960 MHz bands are designated Primary GSM (PGSM). In the following description, GSM will be used in reference to the extended bandwidth (35 MHz) standard.

Figure 6C:
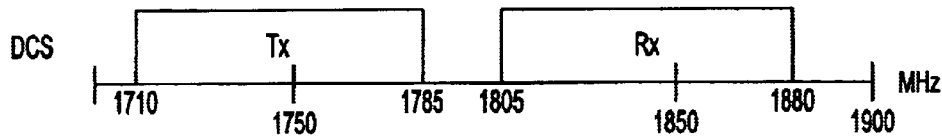
FIG. 6C illustrates the transmit and receive frequency bands under the GSM 1800 or DCS standards.
Figure 6D:
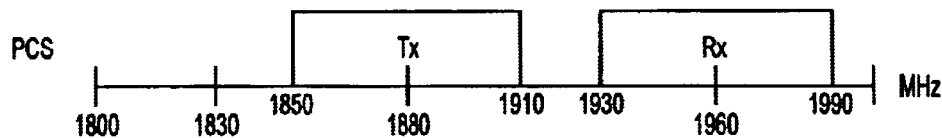
FIG. 6D illustrates the transmit and receive frequency bands under the GSM 1900 or PCS standards.

Due to the expected widespread use of GSM, capacity problems in the 900 MHz frequency bands were anticipated and addressed. ETSI had already defined an 1800 MHz variant (DCS or GSM 1800) in the first release of the GSM standard in 1989. In DCS, the transmission band covers 1710–1785 MHz and the receiving band covers 1805–1880 MHz (FIG. 6c). In the United States, the Federal Communications Commission (FCC) auctioned large blocks of spectrum in the 1900 MHz band, aiming to introduce digital wireless networks to the country in the form of a mass market Personal Communication Service (PCS). The GSM service in the US is known as PCS or GSM 1900. In PCS, the transmission band covers 1850–1910 MHz and the receiving band covers 1930–1990 MHz (FIG. 6d).

Regardless of which GSM standard is used, once a mobile station is assigned a channel, a fixed frequency relation is maintained between the transmit and receive frequency bands. In GSM (900 MHz), this fixed frequency relation is 45 MHz. If, for example, a mobile station is assigned a transmit channel at 895.2 MHz, its receive channel will always be at 940.2 MHz. This also holds true for DCS and PCS; the frequency relation is just different. In DCS, the receive channel is always 95 MHz higher than the transmit channel and, in PCS, the receive channel is 80 MHz higher than the transmit channel. This frequency differential will be referred to in the ensuing discussion as the frequency offset.

Figure 7:
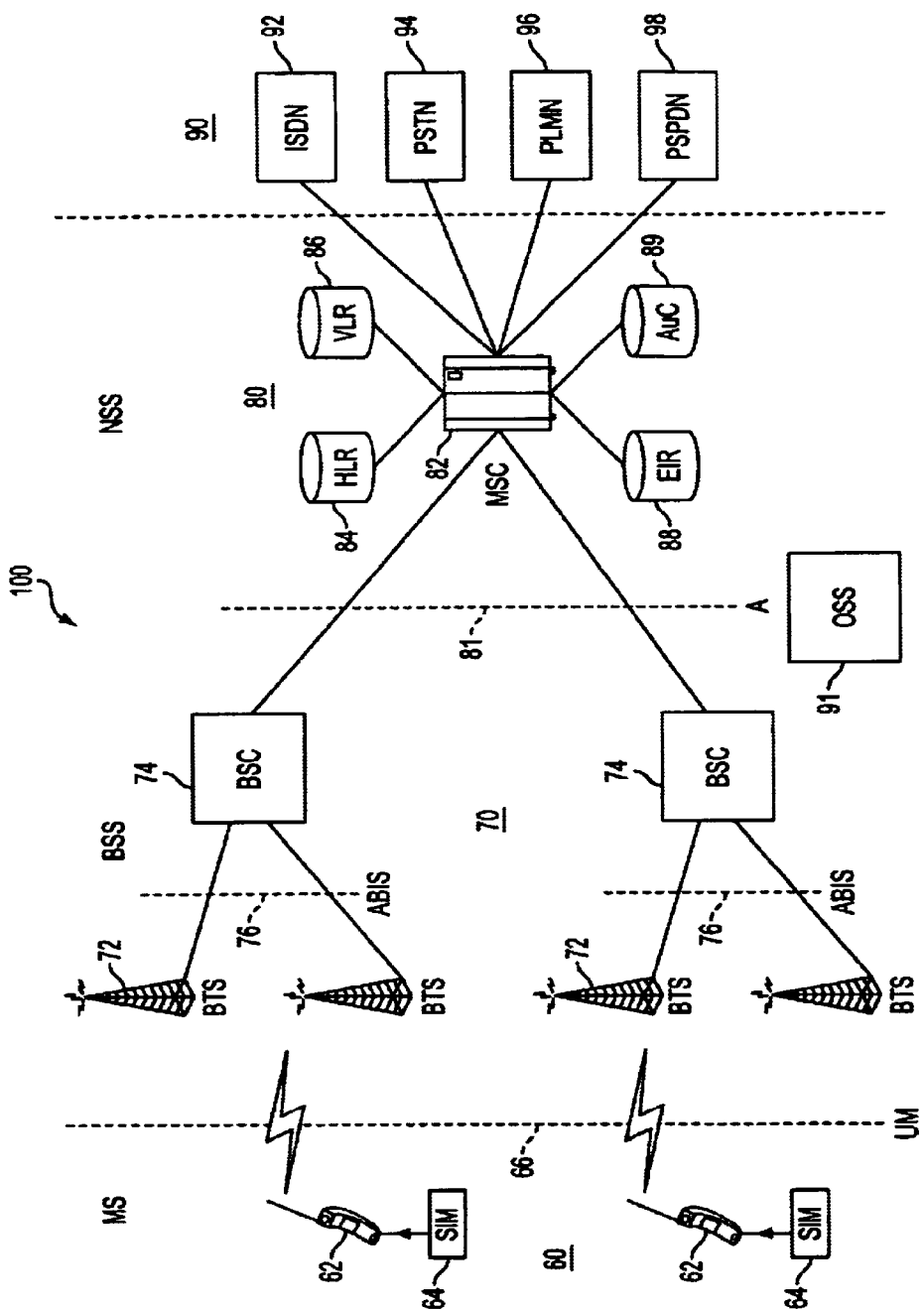
FIG. 7 is a block diagram of an exemplary GSM network.

The architecture of one implementation of a GSM network 100 is depicted in block form in FIG. 7. GSM network 100 is divided into four interconnected components or subsystems: a Mobile Station (MS) 60, a Base Station Subsystem (BSS) 70, a Network Switching Subsystem (NSS) 80 and an Operation Support Subsystem (OSS) 91. Generally, MS 60 is the mobile equipment or phone carried by the user; BSS 70 interfaces with multiple MSs 60 and manages the radio transmission paths between the MSs and NSS 80; NSS 80 manages system switching functions and facilitates communications with other networks such as the PSTN and the ISDN; and OSS 91 facilitates operation and maintenance of the GSM network.

Mobile Station 60 comprises Mobile Equipment (ME) 62 and Subscriber Identity Module (SIM) 64. ME 62 is typically a digital mobile phone or handset. SIM 64 is a memory device that stores subscriber and handset identification information. It is implemented as a smart card or as a plug-in module and activates service from any GSM phone. Among the information stored on SIM 64 are a unique International Mobile Subscriber Identity (IMSI) that identifies the subscriber to system 100, and an International Mobile Equipment Identity (IMEI) that uniquely identifies the mobile equipment. A user can access the GSM network via any GSM handset or terminal through use of the SIM. Other information, such as a personal identification number (PIN) and billing information, may be stored on SIM 64.

MS 60 communicates with BSS 70 across a standardized "Um" or radio air interface 66. BSS 70 comprises multiple base transceiver stations (BTS) 72 and base station controllers (BSC) 74. A BTS is usually in the center of a cell and consists of one or more radio transceivers with an antenna. It establishes radio links and handles radio communications over the Um interface with mobile stations within the cell. The transmitting power of the BTS defines the size of the cell. Each BSC 74 manages multiple, as many as hundreds of, BTSs 72. BTS-BSC communication is over a standardized "Abis" interface 76, which is specified by GSM to be standardized for all manufacturers. The BSC allocates and manages radio channels and controls handovers of calls between its BTSs.

The BSCs of BSS 70 communicate with network subsystem 80 over a GSM standardized "A" interface 81. The A interface uses an SS7 protocol and allows use of base stations and switching equipment made by different manufacturers. Mobile Switching Center (MSC) 82 is the primary component of NSS 80. MSC 82 manages communications between mobile subscribers and between mobile subscribers and public networks 90. Examples of public networks 90 that MSC 82 may interface with include Integrated Services Digital Network (ISDN) 92, Public Switched Telephone Network (PSTN) 94, Public Land Mobile Network (PLMN) 96 and Packet Switched Public Data Network (PSPDN) 98.

MSC 82 interfaces with four databases to manage communication and switching functions. Home Location Register (HLR) 84 contains details on each subscriber residing within the area served by the MSC, including subscriber identities, services to which they have access, and their current location within the network. Visitor Location Register (VLR) 86 temporarily stores data about roaming subscribers within a coverage area of a particular MSC. Equipment Identity Register (EIR) 88 contains a list of mobile equipment, each of which is identified by an IMEI, which is valid and authorized to use the network. Equipment that has been reported as lost or stolen is stored on a separate list of invalid equipment that allows identification of subscribers attempting to use such equipment. The Authorization Center (AuC) 89 stores authentication and encryption data and parameters that verify a subscriber's identity.

OSS 91 contains one or several Operation Maintenance Centers (OMC) that monitor and maintain the performance of all components of the GSM network. OSS 91 maintains all hardware and network operations, manages charging and billing operations and manages all mobile equipment within the system.

Figure 8:
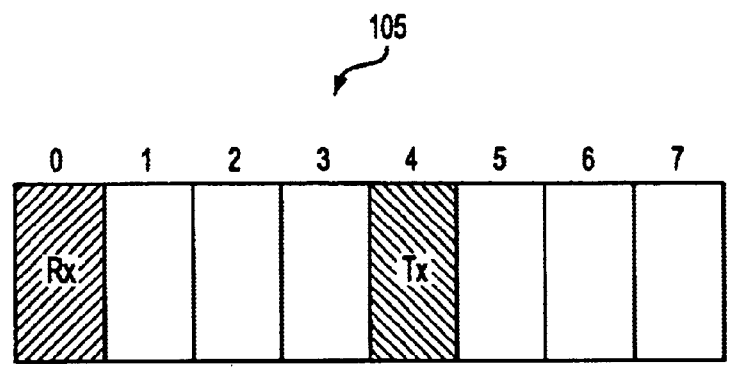
FIG. 8 illustrates the format of a conventional TDMA frame.

The GSM transmitting and receiving bands are divided into 200 kHz carrier frequency bands. Using Time Division Multiple Access techniques (TDMA), each of the carrier frequencies is subdivided in time into eight time slots. Each time slot has a duration of approximately 0.577 ms, and eight time slots form a TDMA "frame", having a duration of 4.615 ms. One implementation of a conventional TDMA frame 80 having eight time slots 0–7 is illustrated in FIG. 8.

In this conventional TDMA framework, each mobile station is assigned one time slot for receiving data and one time slot for transmitting data. In TDMA frame 105, for example, time slot zero has been assigned to receive data and time slot four has been assigned to transmit data. The receive slot is also referred to as the downlink slot and the transmit slot is referred to as the uplink slot. After the eight slots, the remaining slots are used for offset, control, monitoring and other operations. This framework permits concurrent reception by as many as eight mobile stations on one frequency and concurrent transmission by as many as eight mobile stations on one frequency.

As described above, there are currently three GSM frequency bands defined. With the proliferation of wireless handset usage not showing signs of slowing down, it is likely that additional bands will be defined in the future. Hence, GSM mobile stations intended for global usage should have multi-band capability.

Figure 9:
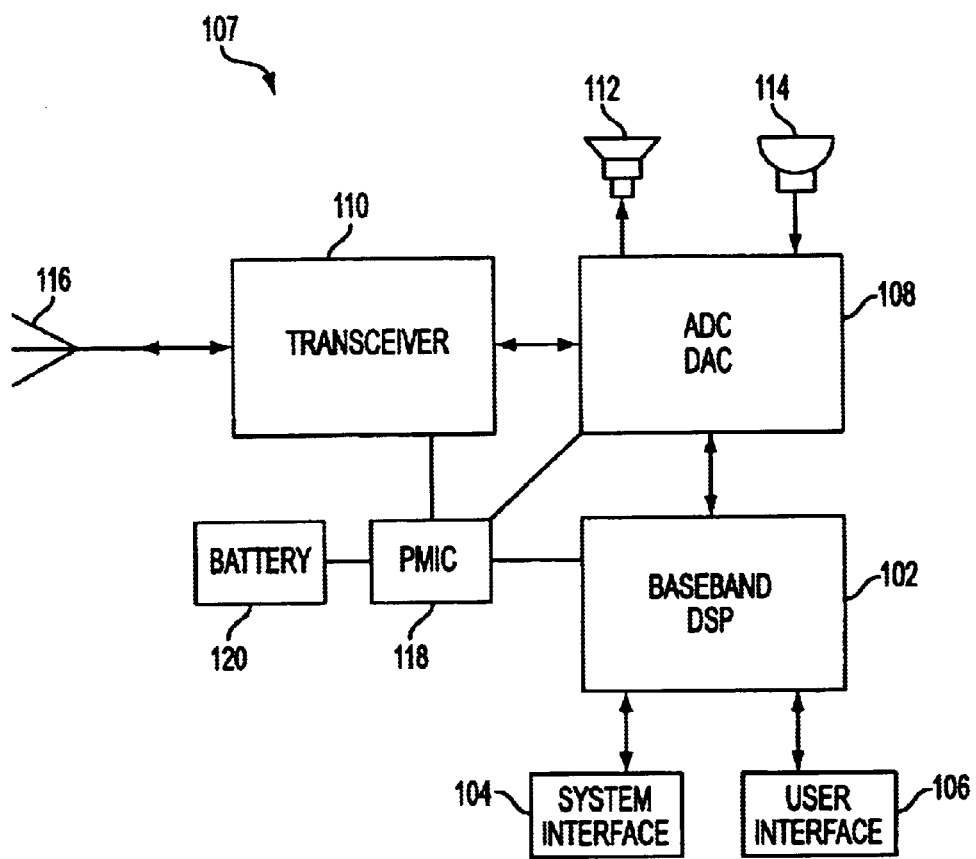
FIG. 9 illustrates a block diagram of a handset or mobile station.

FIG. 9 is a block diagram of one implementation of a mobile, wireless handset 107. Handset 107 may operate as a mobile station within a GSM network, such as a mobile station 62 within a GSM network 100 as illustrated in FIG. 7. Handset 107 includes a baseband digital signal processor (DSP) 102, typically integrated on a single die. Baseband DSP 102 directs the overall operation of mobile station 107. It processes baseband data received from antenna 116 and transceiver 110 into an audible acoustic signal for announcement over speaker 112. DSP 102 also processes acoustic data received from microphone 114 into baseband data which is provided to transceiver 110 for transmission over antenna 116.

DSP 102 also manages system and user interface tasks via a system interface 104 and a user interface 106. System interface 104 may include suitable means for managing functions such as GSM network and modem access and subscriber services. User interface 106 may include suitable means for inputting and displaying information, such as a keypad, display, backlight, volume control and real time clock. In one implementation, DSP 102 is housed in a 128-pin TQFP and, in another implementation, DSP 102 is housed in a 160-pin 12×12 mm Chip Array Ball Grid Array (CABGA).

In one implementation, baseband DSP 102 interfaces with transceiver 110, speaker 112 and microphone 114 via integrated analog IC 108. IC 108 implements an analog-to-digital converter (ADC), a digital-to-analog converter (DAC) and all signal conversions required to permit interface between DSP 102 and transceiver 110, speaker 112 and microphone 114. Typically, the ADC and DAC will be embodied in a CODEC. Microphone 114 is configured to convert acoustic signals, typically those in the audio band, into analog electric signals. The signals captured by microphone 114 are decoded and digitized by the ADC in IC 108 and processed into baseband I and Q signals by DSP 102. The digital baseband I and Q signals are converted into an analog signal stream by the DAC in IC 108, and are then modulated and transmitted (via antenna 116) by transceiver 110. Conversely, modulated signals captured by antenna 116 are demodulated and converted into analog baseband I and Q signals by transceiver 110, digitized by IC 108, processed by DSP 102, and converted into an analog acoustic signal by IC 108 that is announced by speaker 112.

IC 108 may be implemented in a 100-pin TQFP, a 100-pin 10×10 mm CABGA package or in any other suitable housing. A power management IC (PMIC) 118 is coupled to a battery 120 and integrates on a single die all power supply related functions required by handset 107.

Handset 107 may include band selection means (not shown), such as a menu selection or switch, to permit a user to select one of a plurality of possible bands. Alternatively, or in addition, the band selection means may permit automatic selection of the appropriate band, based on a signal from a base station indicating the proper band.

Also included in the handset 107 is a channel selection means (not shown) for selection of the appropriate channel within the selected band responsive to suitable signals from the base station handling the handset at a time. For the GSM, DCS, and PCS bands, the channel is a 200 kHz slot within the selected band. The channel selection means permits selection of either or both of the transmit and receive channels. In one implementation, selection of the transmit channel implies selection of the receive channel, and selection of the receive channel implies selection of the transmit channel, since the two bear a predetermined relationship to one another. For example, for the GSM band, the receive channel is 45 MHz higher than the transmit channel; for the DCS band, the receive channel is 95 MHz higher than the transmit channel; and for the PCS band, the receive channel is 80 MHz higher than the transmit channel. In this implementation, express selection of both the transmit and receive channels is unnecessary.

The handset 107 is preferably configured to permit full duplex transmission, that is, concurrent transmission and reception over respectively the transmit and receive channels.

II. Preferred Embodiments

Figure 2A:
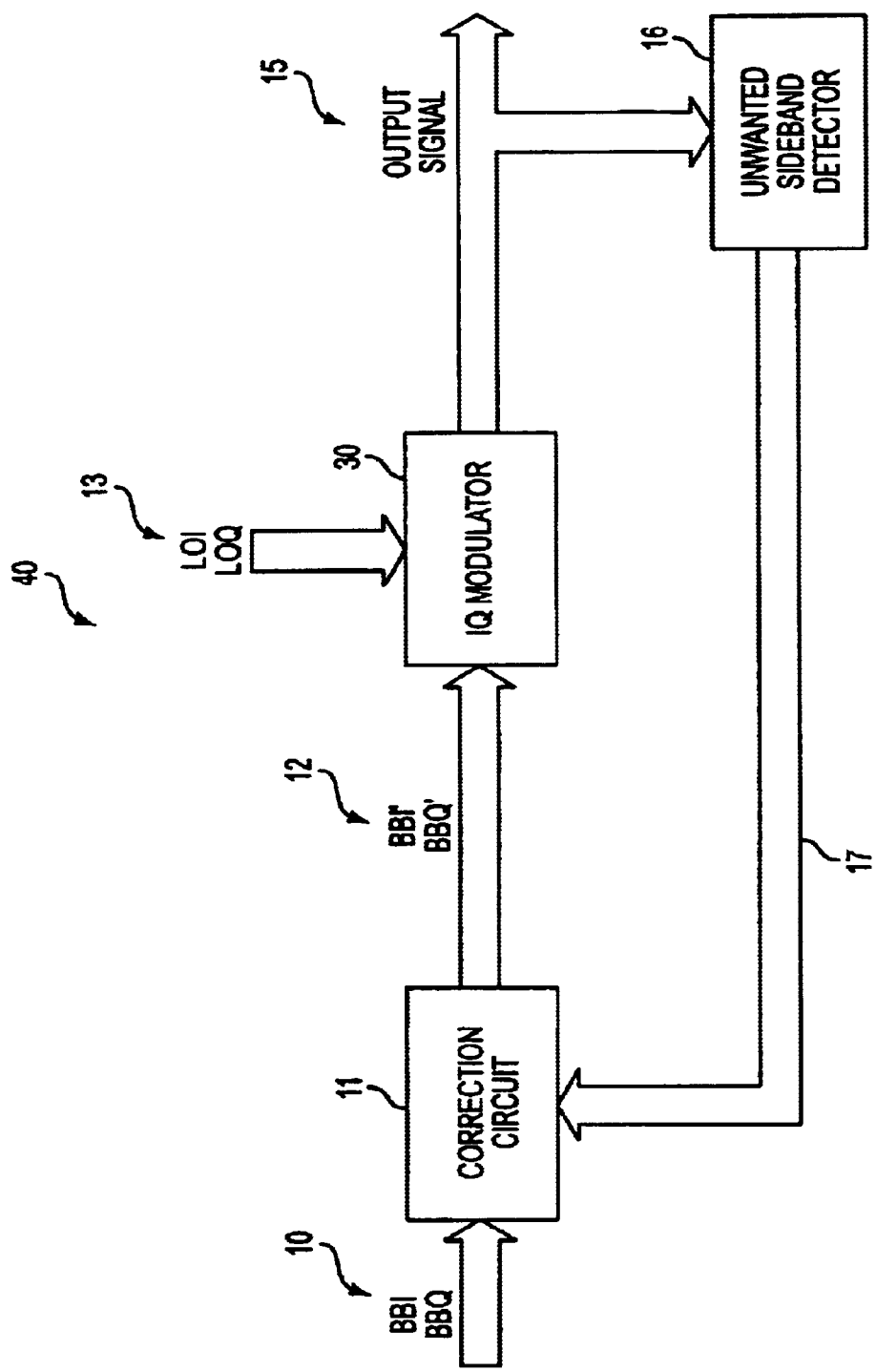
FIG. 2A illustrates a first embodiment of a system in accordance with the subject invention.

A first embodiment of a system 40 in accordance with the subject invention is illustrated in FIG. 2A. As illustrated, in this embodiment, the system 40 comprises a baseband correction circuit 11, a quadrature modulator 30, and an unwanted sideband detector 16. The I and Q components of the baseband signal, BBI and BBQ, identifed with numeral 10, are input to the baseband correction circuit 11. The outputs of the baseband correction circuit, BBI' and BBQ', identified with numeral 12, are input to the quadrature modulator 30. Also input to the quadrature modulator 30 are the I and Q components of the local oscillator signal, LOI and LOQ, identified with numeral 13. The output of the quadrature modulator, identified with numeral 15, is input to the unwanted sideband detector 16. The output of the unwanted sideband detector 16 is input to the baseband correction circuit 11 over signal line 17. Each of these inputs and outputs can either be single-mode or differential-mode signals.

Any inaccuracy in the quadrature of the baseband or local oscillator signals, or in the components of the quadrature modulator, results in an unwanted sideband in the output of the quadrature modulator 30. The unwanted sideband detector 16 detects the presence of an unwanted sideband in the output of the quadrature modulator 30, and provides over signal line 17 a signal representative thereof to the baseband correction circuit 11. In one embodiment, the baseband correction circuit 11 iteratively corrects the phase relationship of the baseband signal 10 responsive to the signal provided by the unwanted sideband detector 16 until that relationship is about a quadrature relationship. In one implementation, the process iterates one or more times until the unwanted sideband in the output of the quadrature modulator 30 has been reduced to an acceptable level.

In one implementation, the unwanted sideband detector is an envelope detector. This implementation of the invention exploits the property that the output of the quadrature modulator can be expressed as the superposition of an AM signal, and an FM signal whose carrier frequency $\omega_c$ is the frequency of the wanted sideband, $\omega_{BB}+\omega_{LO}$, and whose modulation frequency $\omega_m$ is the frequency offset between wanted and unwanted sidebands, $2\omega_{BB}$. Mathemetically, this property can be expressed as follows:

$$S(t) = s_{fm}(t) + s_{am}(t)$$
$$= \sin(\omega_c t) + (B/2)(\sin\{[\omega_c + \omega_m]t\} - \sin\{[\omega_c - \omega_m]t\}) +$$
$$\sin(\omega_c t) + (M/2)(\sin\{[\omega_c + \omega_m]t\} + \sin\{[\omega_c - \omega_m]t\})$$

In the foregoing, the amplitude of the unwanted sideband is (M/2-B/2).

Figure 2B:
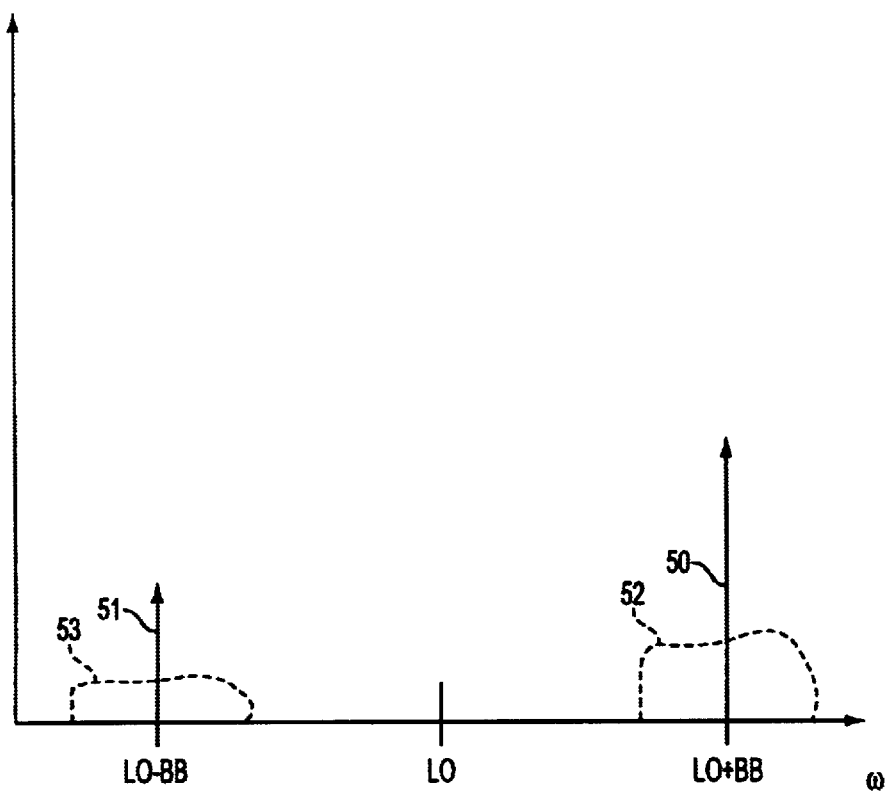
FIG. 2B is a frequency domain representation of the wanted and unwanted sideband components in the output of a quadrature modulator.
Figure 4A:
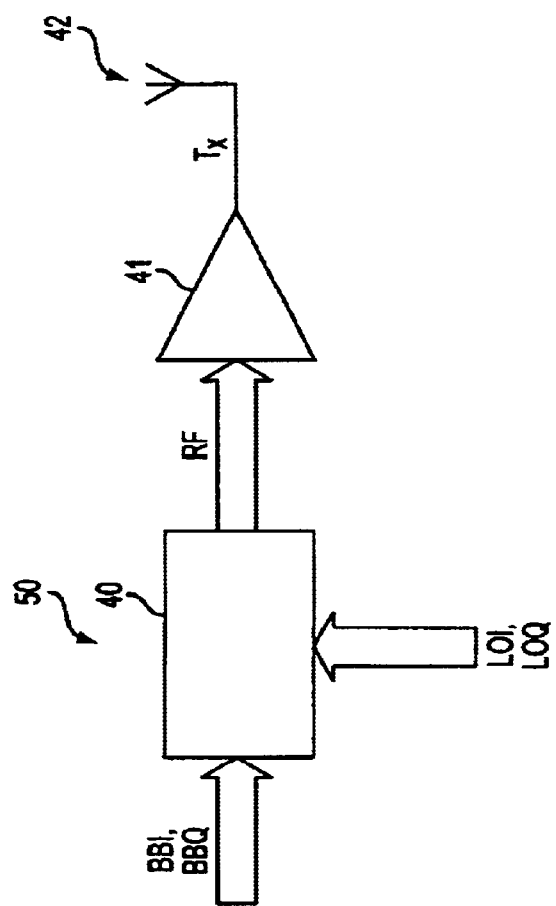
FIG. 4A illustrates a second embodiment of a system in accordance with the subject invention.
Figure 4B:
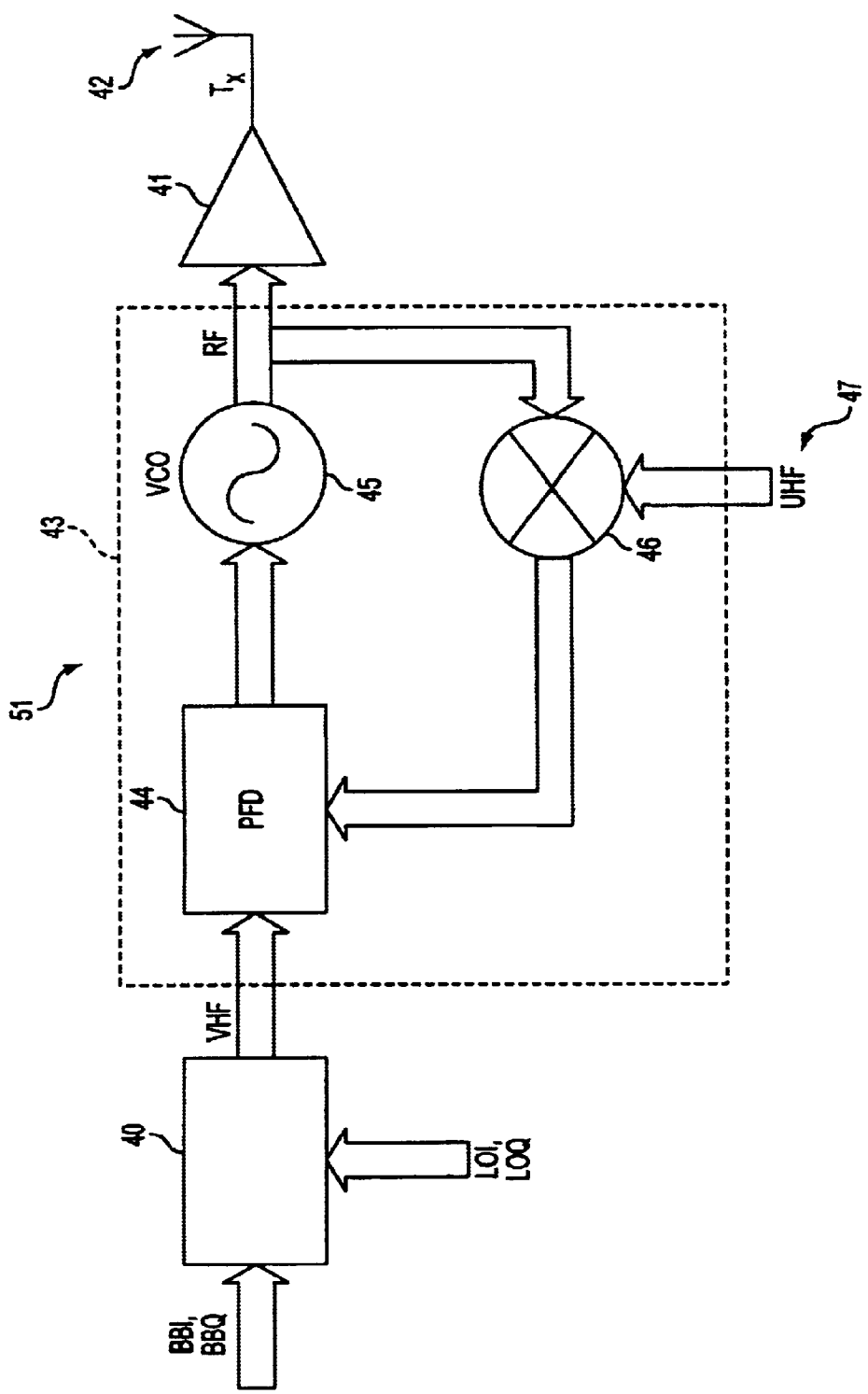
FIG. 4B illustrates a third embodiment of a system in accordance with the subject invention.
Figures 1, 4C:
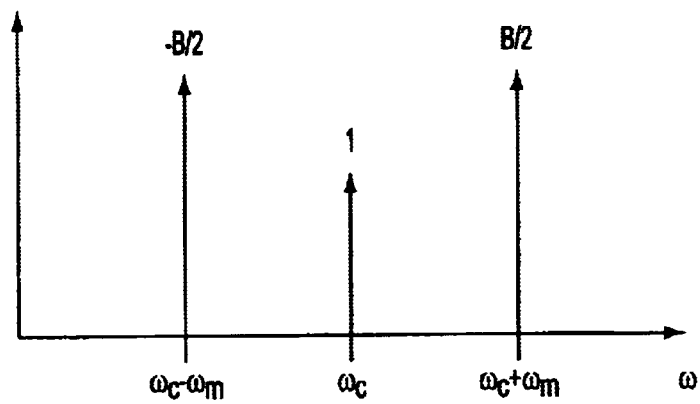
FIG. 4C is a frequency domain representation of the FM and AM signals which, when superimposed, comprise the output of a quadrature modulator.
Figures 2, 4C:
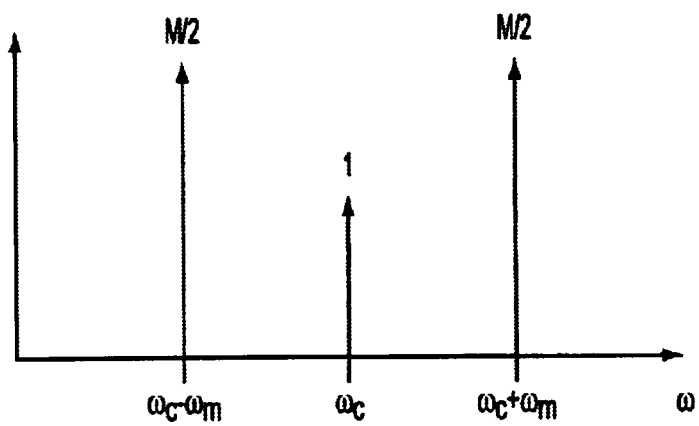
Figures 3, 4C:
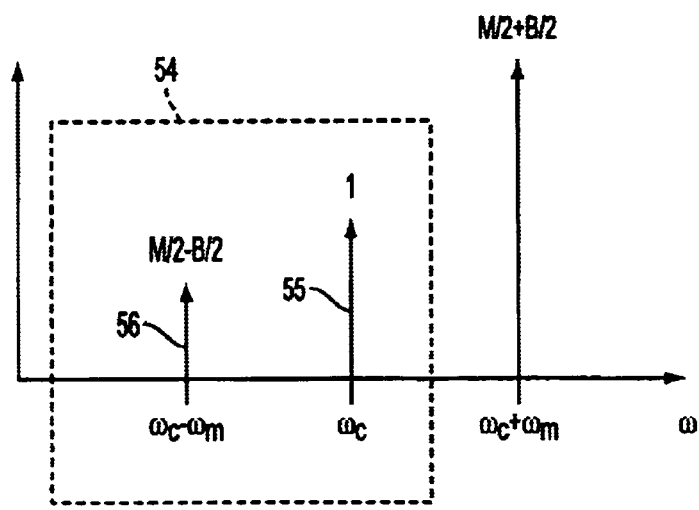

Graphically, this property is illustrated in FIG. 4C. FIG. 4C(1) is a frequency domain representation of the FM component of the output of the quadrature modulator, and FIG. 4C(2) is a frequency domain representation of the AM component of the output of the quadrature modulator. FIG. 4C(3) is a frequency domain representation of the superposition of the signals of FIGS. 4C(1) and 4C(2). Comparing portion 54 of FIG. 4C(3) with FIG. 2B, it can be seen that component 55 of FIG. 4C(3) corresponds to component 50 of FIG. 2B, and component 56 of FIG. 4C(3) corresponds to component 51 of FIG. 2B.

Because of this property, the amplitude of the envelope of the output of the quadrature modulator 30 at a given instant in time is proportional to or representative of the amplitude of the unwanted sideband. Therefore, the signal output by the envelope detector is a direct measure of the unwanted sideband.

In one implementation, correction circuit 11 includes a memory for the storage of one or more parameters. The correction circuit 11 uses the one or more parameters to correct the baseband signal 10. The corrected baseband signal is modulated by modulator 30. The unwanted sideband detector 16 forms a signal representative of any unwanted sideband in the output of the modulator 30. Responsive thereto, the correction circuit 11 revises the one or more parameters as stored in the memory. In one implementation example, the foregoing procedure takes place during a calibration mode of operation, and proceeds until the unwanted sideband is reduced to an acceptable level. The stored parameters are then retained in the memory of the correction circuit for use in correcting the baseband signal during a subsequent transmit mode of operation.

A second embodiment of a system 50 in accordance with the subject invention is illustrated in FIG. 4A. In this embodiment, a direct conversion RF transmitter 50 is provided in which the output of the system 40 of FIG. 2A is coupled to the input of power amplifier 41, and the output of power amplifier 41 is coupled to antenna 42. In this embodiment, the system 40 functions as previously described, and the power amplifier 41 functions to amplify the signal output from the system 40 so that it is received at a corresponding receiver at a desired power level. In this embodiment, the frequency of the local oscillator signal input to the system 40 is such that the output thereof is at the desired transmit frequency.

A third embodiment of a system in accordance with the subject invention is illustrated in FIG. 4B. In this embodiment, an RF transmitter 51 is provided in which the output of the system 40 of FIG. 2A is coupled to a translational loop 43, the output of the translational loop 43 is coupled to a power amplifier 41, and the output of the power amplifier 41 is coupled to antenna 42.

In this embodiment, the output of the system 40 is at an intermediate frequency, such as VHF, and is upconverted to the desired transmit frequency by the translational loop 43. In this embodiment, the system 40 functions as previously described, and the power amplifier 41 functions to amplify the power of the transmitted signal so that the power of the received signal at a corresponding receiver is at a desired level.

The frequency of the local oscillator signal input to the system 40 is such that the output thereof is at the desired intermediate frequency. In one implementation, this desired intermediate frequency is VHF.

In one implementation, translational loop 43 comprises phase detector 44, VCO 45, and mixer 46. The output of system 40 is input to a first input to phase detector 44; the output of phase detector is input to VCO 45; the output of VCO 45 is input to power amplifier 41, and to the RF input to mixer 46; an LO signal 47 is provided to the LO input of mixer 46; and the output of mixer 46 is input to the second input of phase detector 44.

In this implementation, the loop 43 functions as follows. Phase detector 44 adjusts its output until the phases of the signals provided at its two inputs is about the same. Meanwhile, mixer 46 downconverts the frequency of the signal output from VCO 45 by the frequency of the signal provided at its LO input. In one example, the frequency of this signal is the difference between the desired transmit frequency at UHF frequencies and the frequency of the signal output from system 40. The effect of this is to adjust the frequency of the output of VCO 45 until this phase relationship is present. This will occur when the frequency of the signal output from VCO 45 is equal to the frequency of the signal output from system 40 plus the frequency of the LO input to mixer 46.

Figure 5:
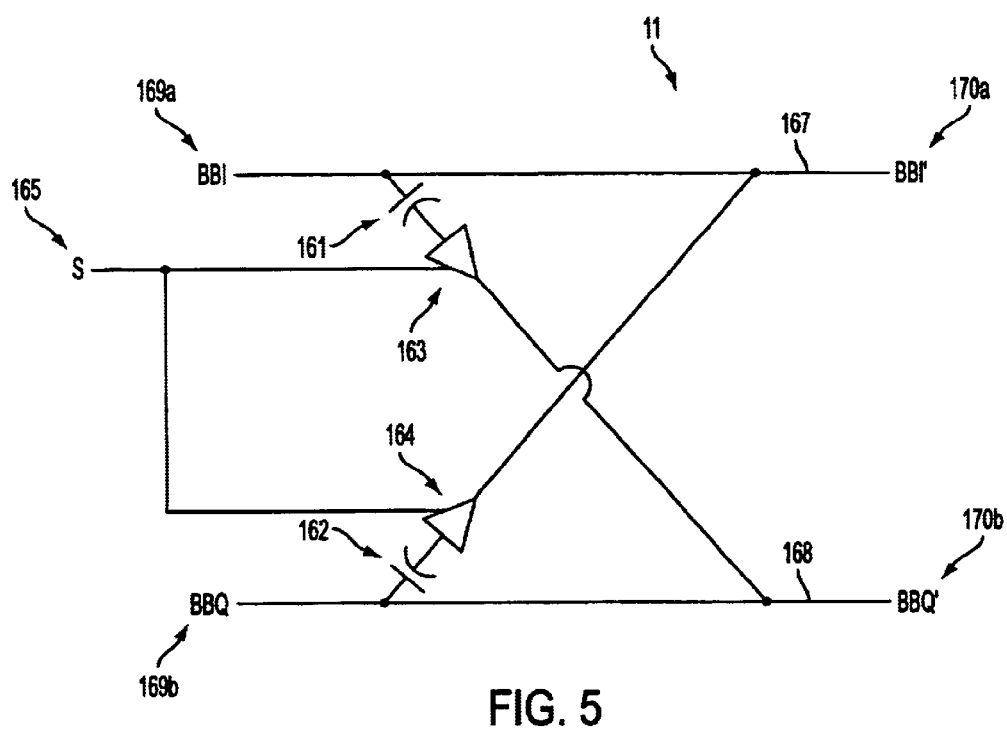
FIG. 5 illustrates an implementation of a baseband correction circuit in accordance with the subject invention.

One implementation of baseband correction circuit 11 is illustrated in FIG. 5. As illustrated, in this implementation, baseband correction circuit 11 comprises inputs 169a and 169b, control input 165, outputs 170a and 170b, signal lines 167 and 168, capacitors 161 and 162, and amplifiers 163 and 164. Input 169a is coupled to output 170a via signal line 167, and input 169b is coupled to output 170b via signal line 168.

The I component of the baseband signal, BBI, is coupled to input 169a, and the Q component of the baseband signal, BBQ, is coupled to input 169b. In addition, the I component of the corrected baseband signal, BBI', is taken from output 170a, and the Q component of the corrected baseband signal, BBQ', is taken from output 170b.

The input to capacitor 161 is coupled to signal line 167, and the output thereof is coupled to the input of amplifier 163. The output of amplifier 163 is coupled to signal line 168.

The output S of unwanted sideband detector 16 is input to the control input of amplifier 163. Thus, the level of amplification provided by amplifier 163 is directly proportional to the signal S. Thus, the amount of unwanted sideband in the output of quadrature modulator 30.

The input to capacitor 162 is coupled to signal line 168, and the output thereof is coupled to the input of amplifier 164. The output of amplifier 164 is coupled to signal line 167. In addition, the output S of unwanted sideband detector 16 is input to the control input of amplifier 164. Thus, the level of amplification provided by amplifier 164 is directly proportional to the signal S, and thus the amount of unwanted sideband in the output of quadrature modulator 30.

This circuit functions by adding a portion of BBQ to BBI to form BBI', with the precise amount added being directly proportional to the signal S, and adding a portion of BBI to BBQ to form BBQ', again with the precise amount added being directly proportional to the signal S. Consequently, the phase relationship between BBI and BBQ is adjusted towards quadrature.

Figure 3A:
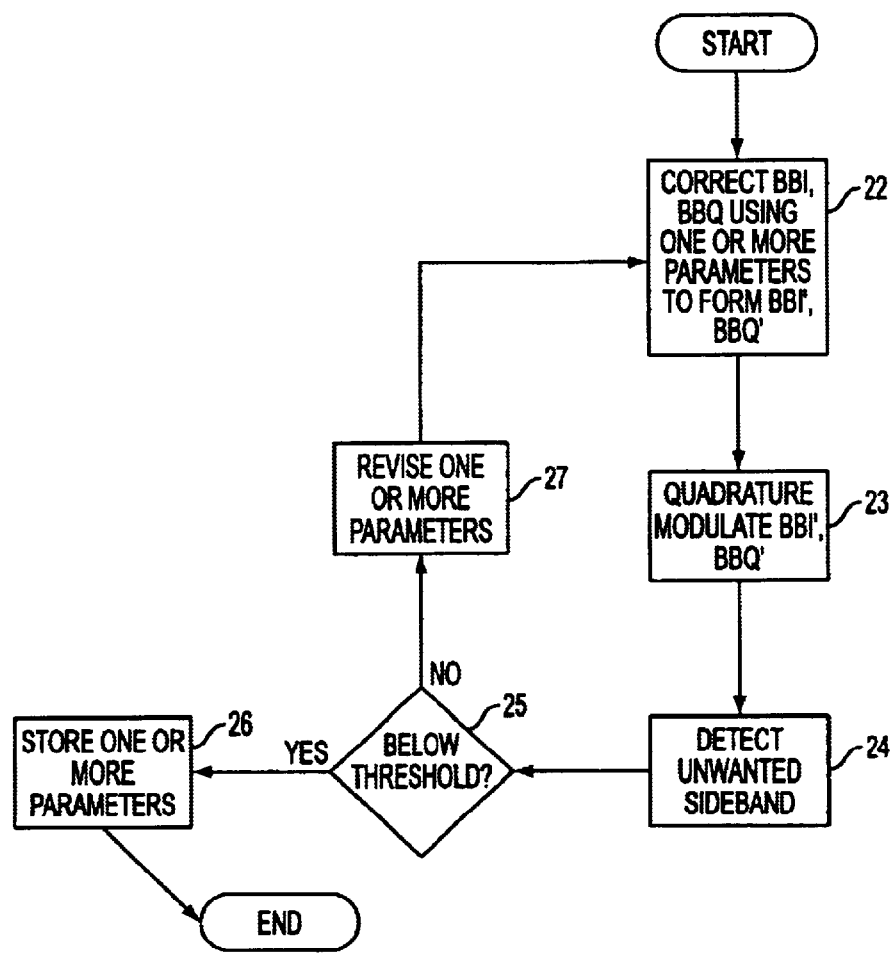
FIG. 3A illustrates a first embodiment of a method in accordance with the subject invention.

A first embodiment of a method in accordance with the subject invention is illustrated in FIG. 3A. As illustrated, this embodiment of the method comprises, in step 22, correcting the I and Q components, BBI and BBQ, of a baseband signal using one or more parameters, thereby forming BBI' and BBQ'; in step 23, quadrature modulating BBI' and BBQ' respectively with the I and Q components of a local oscillator, LOI and LOQ, to form an output signal; in step 24, detecting an unwanted sideband in a signal derived from the output signal; in step 25, determining if the unwanted sideband is below a desired threshold; if so, in step 26, storing the one or more parameters, and ending the process; and if not, in step 27, revising the one or more parameters responsive to the detected unwanted sideband, and the jumping back to the correcting step. In one embodiment, the foregoing steps are repeated one or more times until the unwanted sideband is reduced to an acceptable level. In another embodiment, the foregoing steps are repeated one or more times until the phase relationship between the I and Q components of the baseband signal are about in quadrature.

In one configuration, the foregoing process is performed during a calibration mode of operation, and results in one or more parameters which are stored for use in a subsequent transmit mode of operation in which the baseband signal is corrected using the one or more parameters which result form the process of FIG. 3A.

In one implementation, step 24 comprises detecting the amplitude of the envelope of the output of the quadrature modulator.

Figure 3B:
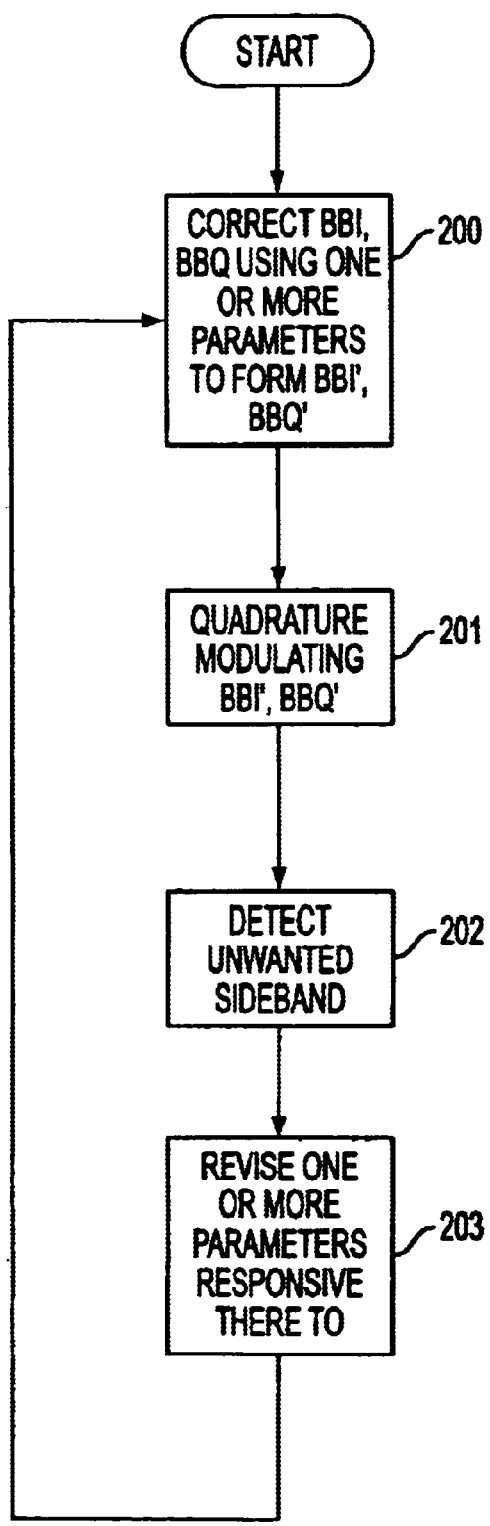
FIG. 3B illustrates a second embodiment of a method in accordance with the subject invention.

A second embodiment of a method in accordance with the subject invention is illustrated in FIG. 3B. This embodiment comprises: in step 200, correcting the components, BBI and BBQ, of the baseband signal using one or more parameters, thereby forming BBI' and BBQ'; in step 201, quadrature modulating BBI' and BBQ' to form an output signal; in step 202, detecting an unwanted sideband is a signal derived from the output signal; in step 203, revising the one or more parameters responsive to the detected unwanted sideband; and jumping back to step 200, whereupon the process may repeat itself one or more times. In one implementation, the foregoing process occurs in real-time during the transmit mode of operation. In one implementation example, the detecting steps comprises detecting the envelope of the signal derived from the output signal.

An advantage of the foregoing method is that the ability to correct for any inaccuracies in the components of the quadrature modulator is provided.

Another advantage is that the ability to correct for any inaccuracies in the quadrature of the I and Q components of the baseband signal is provided.

A third advantage is that a highly accurate phase detector is not required.

A fourth advantage is that correction to a high frequency signal is not required. Instead, the invention only requires correction to the relatively low frequency baseband signal.

While embodiments, implementations, and implementation examples of the subject invention have been shown and described, it should be appreciated that there are many more embodiments, implementations, and implementation examples that are within the scope of the subject invention. Accordingly, the scope of the invention is not to be restricted, except in light of the appended claims and their equivalents.

What is claimed is:

1. A system for reducing or eliminating any unwanted baseband component in the output of a quadrature modulator comprising:

a quadrature modulator for receiving a baseband signal, the baseband signal having I and Q components in a phase relationship, and quadrature modulating a local oscillator signal with the baseband signal to provide a modulator output; an unwanted sideband detector for detecting an unwanted sideband component in and responsive to the modulator output, and outputting a signal representative thereof; and a correction circuit for iteratively adjusting the phase relationship of the I and Q components of the baseband signal responsive to a signal derived from the signal output by the unwanted sideband detector until either the detected unwanted sideband component is reduced to an acceptable level or the adjusted phase relationship of the I and Q components is about a quadrature relationship, wherein the unwanted sideband detector is an envelope detector.

2. The system of claim 1 wherein the local oscillator signal is a quadrature signal having I and Q components.

3. The system of claim 1 in an RF transmitter.

4. The system of claim 1 in a direct conversion transmitter.

5. The system of claim 1 in an RF transmitter in which the system is coupled to a translation loop upconverter.

6. A system for reducing or eliminating any unwanted sideband component in the output of a quadrature modulator comprising:

a quadrature modulator for receiving a baseband signal having I and Q components in a phase relationship, and modulating a local oscillator signal with the baseband signal to provide an output signal, the output signal having an envelope;

an envelope detector for detecting the envelope of the modulator output signal, and outputting a signal representative thereof; and a correction circuit configured to iteratively adjust the phase relationship of the I and Q components of the baseband signal responsive to a signal derived from the signal output by the envelope detector until either the output of the envelope detector reaches an acceptable level or the adjusted phase relationship of the I and Q components is about a quadrature relationship.

7. A method of reducing or eliminating any unwanted sideband in the output of a quadrature modulator comprising the steps of:

quadrature modulating a local oscillator signal responsive to a baseband signal to provide an output signal, the baseband signal having I and Q components in a phase relationship; detecting an unwanted sideband in and responsive to the output signal; and iteratively adjusting the phase relationship of the I and Q components of the baseband signal responsive to a signal derived from the detected unwanted sideband until either the detected unwanted sideband is reduced to an acceptable level or the adjusted phase relationship of the I and Q components is about a quadrature relationship, wherein the output signal has an envelope, and the detecting step comprises detecting the envelope of the output signal.

8. A method for reducing or eliminating any unwanted sideband in a signal derived from the output of a quadrature modulator comprising the steps of:

quadrature modulating a local oscillator signal responsive to a baseband signal to provide an output signal, the baseband signal having I and Q components in a phase relationship, and the output signal having an envelope; detecting the envelope of the output signal; and iteratively adjusting the phase relationship of the I and Q components of the baseband signal responsive to a signal derived from the detected envelope until either the detected envelope reaches an acceptable level or the adjusted phase relationship of the I and Q components is about a quadrature relationship.

9. The method of claim 8, wherein the detected envelope reaches an acceptable level when the unwanted sideband in the output signal is reduced to an acceptable level.

10. The method of claim 9 further comprising storing one or more parameters representative of the phase relationship between I and Q components of the baseband signal upon or after determining that the unwanted sideband has been reduced to an acceptable level.

11. The method of claim 10 further comprising adjusting the phase relationship of the I and Q components of the baseband signal using the one or more stored parameters in a subsequent transmit mode of operation.

12. A method of reducing or eliminating any unwanted sideband in a signal derived from an output of the quadrature modulator, comprising the steps of:

quadrature modulating a local oscillator signal with a baseband signal to form an output signal, the baseband signal having I and Q components in a phase relationship, the output signal having an envelope; detecting the envelope in and responsive to the output signal; adjusting the phase relationship of the I and Q components of the baseband signal responsive to a signal derived from the detected envelope; and repeating the foregoing process until either the signal derived from the detected envelope reaches an acceptable level or the adjusted phase relationship of the I and Q components is about a quadrature relationship.

13. The system of claim 1 wherein the correction circuit is configured to store in a memory one or more parameters representative of the phase relationship between the I and Q components of the baseband signal upon or after determining that the unwanted sideband component has been reduced to an acceptable level.

14. The system of claim 6 wherein the correction circuit is configured to store in a memory one or more parameters representative of the phase relationship between the I and Q components of the baseband signal upon or after determining that the unwanted sideband component has been reduced to an acceptable level.

15. The system of claim 14 wherein the correction circuit is configured to store the one or more parameters in the memory during a calibration mode of operation.

16. The method of any claim 7 and 8 which is performed during a calibration mode of operation.

17. The system of claim 15 wherein the correction circuit is configured to adjust the phase relationship between the I and Q components of the baseband signal using the stored one or more parameters during a subsequent transmit mode of operation.

18. A system for reducing or eliminating any unwanted sideband component in the output of a quadrature modulator comprising:

a quadrature modulator for quadrature modulating a complex carrier signal with a complex baseband signal to provide a complex output signal, the complex baseband signal having I and Q components and one or more parameters including a phase relationship between the I and Q components thereof;

an unwanted sideband detector for detecting an unwanted sideband component in and responsive to the modulator output, and outputting a signal representative thereof, wherein the unwanted sideband detector includes an envelope detector; and a correction circuit for iteratively adjusting one or more of the parameters of the complex baseband signal responsive to a signal derived from the output of the unwanted sideband detector until either the detected unwanted sideband component is reduced to a predetermined level or the phase relationship of the I and Q components is about a quadrature relationship.

19. The system of claim 18 wherein the parameter which is adjusted by the correction circuit is the phase relationship between the components of the complex baseband signal.

20. The system of claim 18 further comprising a memory for storing data representative of the adjusted one or more parameters of the complex baseband signal determined upon or after the unwanted sideband component has been reduced to a predetermined level.

21. The system of claim 20 wherein the correction circuit is configured to use the data to adjust the one or more parameters of the complex baseband signal outside the calibration mode of operation.

22. The system of claim 18 wherein the correction circuit is configured to adjust the one or more parameters of the complex baseband signal during a calibration mode of operation.

23. The system of claim 18 wherein the correction circuit is configured to adjust the one or more parameters of the complex baseband signal outside a calibration mode of operation.

24. The system of claim 23 wherein the signal derived from the output of the unwanted sideband detector is derived from data stored in a memory, wherein the data is derived from the output of the unwanted sideband detector.

25. A method of reducing or eliminating any unwanted sideband component in the output of a quadrature modulator comprising:

quadrature modulating a complex carrier signal with a complex baseband signal to provide a complex output signal, the complex baseband signal having I and Q components and one or more parameters including a phase relationship between the I and Q components;

detecting an unwanted sideband component in and responsive to the complex output signal, and outputting a signal representative thereof; and iteratively adjusting one or more of the parameters of the complex baseband signal responsive to a signal derived from the signal representative of the unwanted sideband component in the complex output signal until the detected unwanted sideband component is reduced to a predetermined level or the phase relationship of the I and Q components is about a quadrature relationship, wherein the detecting step includes detecting the envelope of the complex output signal, and outputting a signal representative thereof.

26. The method of claim 25 wherein the parameter which is adjusted is the phase relationship between the components of the complex baseband signal.

27. The method of claim 25 further comprising storing data representative of the adjusted one or more parameters of the complex baseband signal determined upon or after the unwanted sideband component has been reduced to a predetermined level.

28. The method of claim 27 further comprising using the data to adjust the one or more parameters of the complex baseband signal o,side a calibration mode of operation.

29. The method of claim 25 wherein the adjusting step is performed during a calibration mode of operation.

30. The method of claim 25 wherein the adjusting step is performed outside a calibration mode of operation.

31. The method of claim 30 wherein the signal derived from the signal representative of the unwanted sideband component is derived from stored data, wherein the stored data is derived from the signal representative of the unwanted sideband component.

* * * * *